United States Patent [19]

Howell

[11] 4,080,573
[45] Mar. 21, 1978

[54] BALANCED MIXER USING COMPLEMENTARY DEVICES

[75] Inventor: William Junior Howell, Tempe, Ariz.
[73] Assignee: Motorola, Inc., Schaumburg, Ill.
[21] Appl. No.: 706,036
[22] Filed: Jul. 16, 1976
[51] Int. Cl.² ............................................. H04B 1/06
[52] U.S. Cl. .................... 325/439; 325/446; 325/436; 325/451
[58] Field of Search ............... 325/438, 439, 443, 442, 325/444, 445, 446, 451, 105, 138, 436, 450; 332/31 T, 43 B, 44; 328/156, 158

[56] References Cited

U.S. PATENT DOCUMENTS

| | | | |
|---|---|---|---|
| 2,044,745 | 6/1936 | Hansell | 325/436 |
| 2,857,511 | 10/1958 | Tongue | 325/450 |
| 2,923,888 | 2/1960 | Buesing | 328/156 |
| 3,241,071 | 3/1966 | Alford | 325/445 |
| 3,416,086 | 12/1968 | Carlson | 325/436 |
| 3,694,756 | 9/1972 | Carlson | 325/451 |
| 3,727,078 | 3/1966 | Wollesen | 325/450 |

Primary Examiner—Robert L. Griffin
Assistant Examiner—Tommy P. Chin
Attorney, Agent, or Firm—Maurice J. Jones, Jr.

[57] ABSTRACT

Frequency changing circuits are disclosed which each include an unbalanced input circuit, complementary mixing devices and a balanced output circuit. The mixer input signals are cancelled in the balanced output circuit. Moreover, whatever mixer out-of-phase output signals that are undesirably fed back to the input circuit are cancelled in the unbalanced input circuit. Also, circuitry is disclosed for rendering one or the other of the complementary mixing transistors inoperative so that the other of the complementary transistors can operate as a neutralized amplifier for utilization in a television receiver adapted to receive both VHF and UHF signals.

14 Claims, 8 Drawing Figures

BALANCED MIXER USING COMPLEMENTARY DEVICES

BACKGROUND OF THE INVENTION

The mixer or frequency changer stages of superheterodyne receivers change the frequency of an incoming Radio Frequency (RF) signal to a lower Intermediate Frequency (IF) signal. The consequent reduction of the frequency of operation of the stages subsequent to the mixer generally allows the superheterodyne receiver system to be superior to other receiver systems with respect to stability, gain and selectivity. The chief disadvantages of utilizing prior art mixer circuits for lowering the frequency of operation are the potential of increased internally generated noise, production of spurious responses and distortion.

More specifically, the mixers of superheterodyne receivers tend to create undesired signal outputs. This unique and unfortunate property is due to the ability of the mixer to generate sum and difference frequencies for all input signals that happen to be applied to the input terminal of the mixer. These input signals include the desired signals coming from mixer driving stages and sometimes undesired signals occurring in stages subsequent to the mixer which are fed back to the input terminal of the mixer. For instance, a problem sometimes created by prior art mixers in television receivers relates to "Channel 6 Beats." If the television receiver is tuned to Channel 6 the picture carrier and sound carrier occur at the mixer input terminal. The mixer adds the carrier component of the picture (83.25 MHz) to the sound carrier component (87.75 MHz) and subtracts this sum from the local oscillator frequency (129 MHz) to create a spurious signal having a frequency of about 42 MHz. The unwanted spurious 42 MHz signal then passes through the 42.17 MHz chroma processing channel and interfers with the quality of the color signal. Hence, the same second order nonlinearities of the mixer which enables it to translate the incoming signal to a desired lower intermediate frequency also enables prior art mixers to generate spurious signals which can fall within the desired pass band of the receiver. Furthermore, higher order mixer nonlinearities can provide other types of undesired mixer responses.

Prior art single device mixers also sometime suffer from other sorts of distortion problems. More specifically, cross modulation is another type of undesired or spurious mixer response which occurs because of the third order nonlinearities of the mixer device. The amount of undesired cross modulation is somewhat proportional to the local oscillator and RF signal power delivered to each active device of the mixer. Also, mixers employing only one device sometimes lack dynamic range. More specifically, single device mixers have a limited ability to accept local oscillator and RF input signals of high magnitudes without being driven into saturation or cutoff. Also, a further problem of prior art single device mixers is associated with the input impedance of the device changing with the local oscillator signal thereby causing driving source impedance distortion. In addition, some prior art unbalanced mixer circuits allows local oscillator and RF signals to be created at the output terminal thereof which pass into and cause distortion by undesired mixing action in subsequent stages.

Further problems associated with some prior art mixers relate to noise generation. Since mixing action normally occurs near the beginning of the signal stream of a receiver, any noise generated therein will be amplified by subsequent stages. Solid state mixing devices utilize P-N junctions which create noise. It is of course desirable to provide a mixer circuit which minimizes the effects of such noise.

Some prior art mixer circuits require balanced (double ended) drive. Such circuits generally are not suitable for use with present day television tuners and other driving circuits arranged to provide unbalanced (single ended) RF input signals. This is because such balanced drive mixer circuits require that more driving connections be switched when channels are changed than do the mixers with unbalanced input circuits. Accordingly, unbalanced mixer circuits used in television receivers, for instance, enable simplification of the present day tuner.

The current trend particularly in consumer electronics is to provide integrated circuits which include one or more stages hence introducing economy while at the same time providing excellent performance and improved reliability. For instance, it is desired to provide an integrated circuit that includes some combination of the RF amplifiers, oscillators, mixers and IF amplfiers for a television receiver. Some prior art mixer stages utilize field effect devices which are not suitable for being economically provided in bipolar integrated circuit form. Other prior art circuit configurations are too complex, and require too many external connections or components to be economically provided in integrated circuit form. Also, it is desirable in modern day television receivers to provide a Very High Frequency (VHF) mixer which can be easily changed to an IF amplifier for use at Ultra High Frequency (UHF) and which is manufacturable in integrated circuit form.

SUMMARY OF THE INVENTION

An object of the invention is to provide an improved mixer circuit configuration.

Another object of the invention is to provide a mixer circuit configuration which develops or contributes to the development of only minimal amounts of distortion and spurious output signals.

Still another object of the invention is to provide a mixer circuit configuration which develops only a minimal amount of noise.

A further object of the invention is to provide a mixer circuit suitable for being driven by a single-ended or unbalanced input signal.

An additional object of the invention is to provide television receiver mixer circuit configuration for use at VHF frequencies and which can be switched to operate as an IF amplifier when receiving UHF frequencies.

An additional object of the invention is to provide a mixer circuit configuration which is suitable for being either partially or nearly completely implemented in integrated circuit form.

Briefly, the frequency changing circuit of the invention is suitable for subtracting the frequencies of local oscillator and input signals to provide an intermediate frequency output signal. The frequency changing circuit includes an unbalanced input circuit which is adapted to provide the local oscillator and other mixer input signals at first and second terminals thereof. A first electron control device of one conductivity type includes a control electrode which is connected to one of the terminals of the unbalanced input circuit and a second electron control device of the other conductivity type includes a control electrode connected to the other terminal of the unbalanced input circuit. The first and second electron control devices are arranged to be rendered more conductive on the different alternate half cycles of the local oscillator signal to provide the intermediate frequency signal component at the output electrodes thereof. A tuned circuit is connected between the output electrodes of the first and second electron control devices for developing a balanced intermediate frequency signal component thereacross while rejecting undesired mixer signal components. The electron control devices produce in-phase versions of the mixer input signal across the tuned circuit which result in substantially no net mixer input signals being developed at the mixer output terminal. Also, capacitances associated with the electron control devices feedback substantially equal out-of-phase mixer output signals which are cancelled in the input circuit of the mixer.

DETAILED DESCRIPTION OF THE PREFERRED EMBODIMENTS

Figure 1:
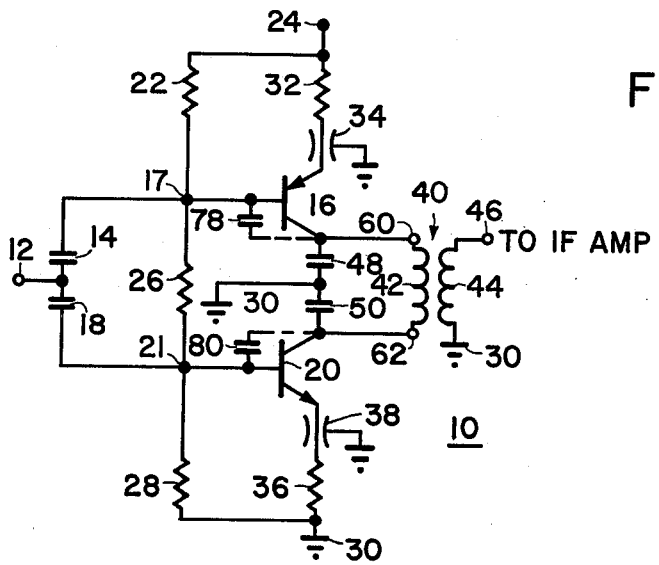
FIG. 1 is a schematic diagram of a mixer circuit of one embodiment of the invention.

FIG. 1 is a schematic diagram of mixer or frequency changer circuit 10 of one embodiment of the invention. Input terminal 12 is coupled through capacitor 14 to the base of PNP transistor 16 and through capacitor 18 to the base of NPN transistor 20. Field effect transistors could be substituted for transistors 16 and 20. Transistors 16 and 20 are constructed to have parameters that are as closely matched as practicable and they could be fabricated in the same integrated circuit which could also include other components or circuits. Alternatively, transistors 16 and 20 could be provided by themselves in the same piece of semiconductor material or they could be discrete transistors. Coupling capacitors 14 and 18 prevent the DC (direct current) components of the RF and local oscillator signals applied to terminal 12 from interferring with the operation of mixer 10. Capacitors 14 and 18 also provide DC isolation between the base electrode of transistors 16 and 20. These signals can be applied to terminal 12 by series or parallel connected RF and local oscillator signal sources. The values of capacitors 14 and 18 are selected to have low impedances at the RF and local oscillator frequencies.

Bias resistor 22 is connected between positive power supply terminal or conductor 24 and the base electrode of transistor 16 and terminal 17, bias resistor 26 is connected between the base electrodes of transistors 16 and 20, and bias resistor 28 is connected between the base electrode of transistor 20 through terminal 21 and the ground or reference potential terminal or conductor 30. A series circuit including bias resistor 32 and feedthrough capacitor 34 is connected between power supply terminal 24 and the emitter of transistor 16. Similarly, a series circuit including bias resistor 36 and feed through capacitor 38 is connected between the emitter electrode of transistor 20 and reference potential terminal 30.

Transformer 40 includes a primary winding 42 connected between the collectors of transistors 16 and 20 and a secondary winding 44 connected between reference terminal 30 and mixer output terminal 46. Capacitors 48 and 50 are respectively connected between the collectors of transistors 16 and 20 and reference terminal 30. The values of capacitors 48 and 50 are selected to provide a low impedance for unwanted signals to ground and to form a parallel resonant circuit with primary winding 42 at the IF frequency. During quiescent or no signal operation, transistors 16 and 20 can be biased to operate Class A, B or AB.

In mixer circuit 10, resistors 22 and 28 should have equal values. Also resistors 32 and 36 should have equal values. Transistors 16 and 20 should have matched betas to facilitate balanced operation.

Figure 2:
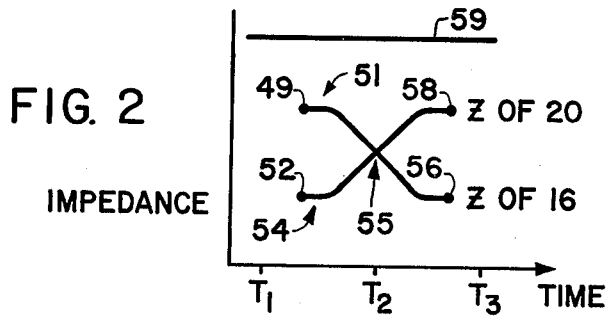
FIG. 2 is a set of graphs illustrating the constant dynamic input impedance offered by the mixer circuit of FIG. 1 to a driving source.

Mixer 10 tends to eliminate driving source distortion. During dynamic operation the local oscillator signal having a relatively large amplitude and the RF signal having a relatively small magnitude are applied to input terminal 12 by the driving sources coupled thereto. As the sinusoidal local oscillator signal swings to its positive limit at time T1, NPN transistor 20 is rendered more conductive and complementary PNP transistor 16 is rendered less conductive. Therefore, at time T1 the impedance of transistor 16 is high as represented by point 49 on curve 51 of FIG. 2 as compared to the impedance of transistor 20 as represented by point 52 on curve 54. As the local oscillator signal goes through its zero crossing at time T2 of FIG. 2 the impedances of matched transistors 16 and 20 become about equal to each other as indicated at point 55. As the amplitude of the local oscillator signal swings in the negative direction, the impedance of transistor 16 becomes less than the impedance of transistor 20 as indicated by respective points 56 and 58 on curves 51 and 54. Therefore, the circuit of FIG. 1 tends to provide a substantially constant composite load impedance to the driving sources coupled to input terminal 12 as illustrated by line 59 of FIG. 2. Consequently, mixer circuit 10 tends to have less driving source impedance distortion than some prior art mixer configurations.

Figure 3:
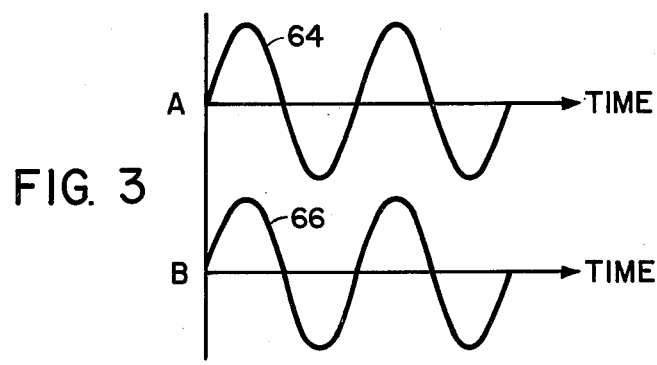
FIG. 3 shows a pair of waveforms which illustrates the cancellation of the local oscillator, RF input signals and other first order input signals in the output circuitry of the mixer of FIG. 1.

Mixer 10 tends to prevent the input signals thereof from occurring at output terminal 46. As transistor 16 is rendered less conductive, in response to the positive going portion of any sinusoidal input signal, terminal 60 of primary winding 42 is thereby made more negative. At the same time transistor 20 becomes more conductive thereby causing the potential at terminal 62 of winding 42 to also increase in the negative direction. When the sinusoidal input signal to the oscillator swings in the negative direction then transistor 16 is rendered more conductive to provide a more positive potential at end 60 of winding 42 and transistor 20 is rendered less conductive to likewise provide a more positive potential at end 62 of winding 42. Consequently, transistors 16 and 20 tend to provide sinusoidal signals at each end of winding 42 which are in-phase in response to sinusoidal input signals, as illustrated by respective waveforms 64 and 66 of FIG. 3A and 3B. These in-phase output signals produce substantially no signal in winding 42 and consequently no signal at output terminal 46. Thus, the local oscillator signal, RF input signal and other signal components in the input circuit of mixer 10 tend to be cancelled by the action of complementary transistors 16 and 20 so long as the electrical parameters of these transistors are closely matched. Accordingly, the mixer circuit of FIG. 1 tends to eliminate from the output thereof, the first order input signals applied thereto which reduces the distortion otherwise undesirably caused by such signals in subsequent stages, for instance.

Mixer circuit 10 changes the frequency of an incoming RF carrier and its sidebands to lower frequencies. Although the carrier and sideband frequencies are changed to lower frequencies, the original frequency separation between the carrier and each sideband is maintained. Hence, the mixing process does not change the information of the modulated RF input signal. The oscillator signal should have a much greater magnitude than the modulated RF signal. However if the oscillator signal magnitude is too great the noise level of the mixer output signal will undesirably increase.

Figure 4:
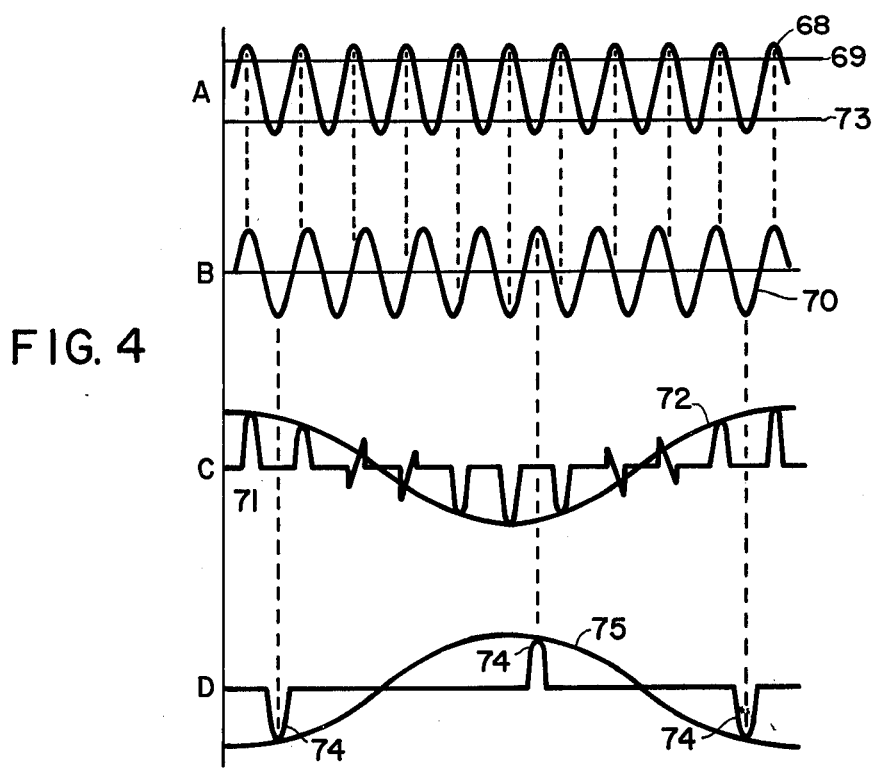
FIG. 4 includes a set of graphs illustrating the mixing action of the mixer circuit of FIG. 1.

In FIG. 4A, sinusoidal signal 68 represents the local oscillator signal applied to transistors 16 and 20. Level 69 represents an assumed bias level for transistor 20 and sinusoidal signal 70 of FIG. 4B represents one of the sinusoidal components of the modulated RF signal. Transistor 20 can be considered to be a switch that is turned on and off by oscillator signal 68 to permit small samples of signal 70 to reach winding 42. More particularly, transistor 20 is rendered conductive by the portions of waveform 68 extending above line 69 so that samples of waveform 70 are applied to winding 42 to cause current pulses therein which are designated in FIG. 4C by reference number 71. Pulses 71 are smoothed out by the tuned circuit including inductor 42 and capacitors 48 and 50 to provide waveform 72 at end 62 of winding 42.

An assumed bias level 73 for PNP transistor 20 is shown in FIG. 4A. The negative portions of local oscillator signal 68 extending below level 73 cause PNP transistor 16 to be rendered conductive. Consequently, PNP transistor 78 samples RF signal component 70 on different alternate half cycles of the local oscillator signal to produce pulses 74, some of which are shown in FIG. 4D. Pulses 74 are also smoothed out by the parallel tuned circuit including capacitors 48, 50 and inductor 42 to provide the waveform 75 of FIG. 4D at end 60 of primary winding 42. Hence, a balanced signal corresponding to the RF signal component but at the IF frequency is generated across primary winding 42. This balanced or differential signal is transformed into an unbalanced or single-ended signal by secondary winding 44 of transformer 40 and applied to output terminal 46. Since a modulated signal can be considered as being comprised of many components 70, by applying the above description to each component the reduction in frequency of all the frequency components of the modulated signal can be understood. Also, if devices 16 and 20 are biased Class A then the operation of mixer 10 can be understood by realizing that the transconductance (gm) of each of devices 16 and 20 increases as the current through it increases in response to different alternate half cycles of the local oscillator signal to provide mixing action.

Dashed capacitances 78 and 80 represent the collector-to-base junction capacitances of transistors 16 and 20. Since the balanced IF signals at ends 60 and 62 of winding 42 are 180° out-of-phase, then assuming that capacitances 78 and 80 are equal whatever IF signal fed back by one of capacitors 78 or 80 will tend to be cancelled at the unbalanced input circuit of mixer 10 by the signal fed back through the other capacitance. Thus, the IF signal will not be available at the input of mixer 10 to mix with other mixer input signals and produce spurious responses. Also, the effects of the nonlinearities of the base-to-emitter junctions of transistors 16 and 20 tend to cancel each other and thereby reduce undesirable results such as cross modulation and "Channel 6 Beats."

Figure 5:
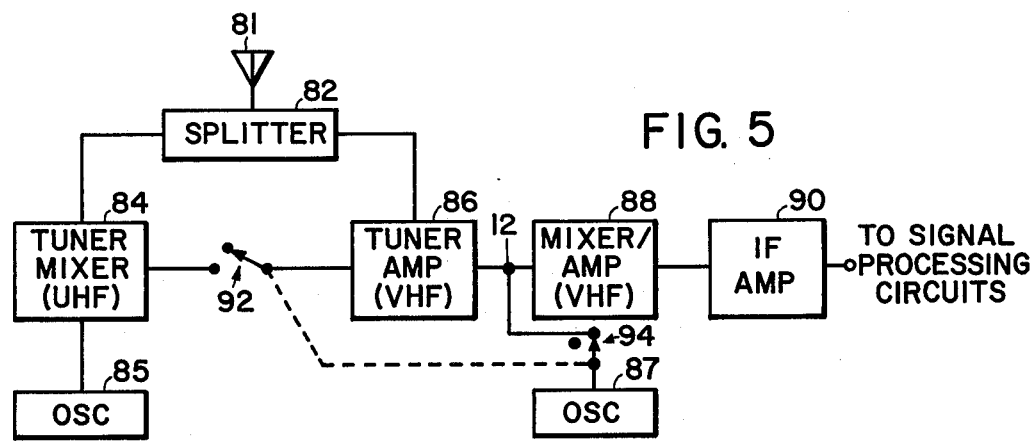
FIG. 5 is a block diagram of the front end of a typical television receiver suitable for processing UHF and VHF signals.

FIG. 5 is a block diagram of the "front end" of a television receiver suitable for receiving and processing either VHF or UHF television signals. More specifically, antenna 81 intercepts both VHF and UHF television signals and applies them to splitter 82 which separates them and applies the UHF signal to UHF Tuner/Mixer 84 and the VHF signals to VHF Tuner/Amplifier 86. Tuner/Mixer 84 is adapted to receive a local oscillator signal from oscillator 85. The input terminal of Mixer/Amplifier 88 is connected to the output terminal of Tuner/Amplifier 86 and sometimes to the output terminal of oscillator 87. The output terminal of Mixer/Amplifier 88 is connected to the input terminal of IF amplifier 90 which provides the television signals for processsing by the remainder of the receiver in a known manner. Switch 92 is arranged to connect the output terminal of Tuner/Mixer 84 to the input terminal of Tuner/Amplifier 86 during UHF operation and to disconnect the output terminal of Tuner/Mixer 84 from the input terminal of Tuner/Amplifier 86 during VHF operation. Switch 94, which can be ganged with switch 92, is arranged to connect the output terminal of oscillator 87 to the input terminal of Mixer/Amplifier 88 during VHF operation and to disconnect oscillator 87 from Mixer/Amplifier 88 during UHF operation. During VHF operation Mixer/Amplifier 88 operates as a mixer in the aforementioned manner. During UHF operation it is desirable for Mixer/Amplifier 88 to operate as an IF amplifier.

Figure 6:
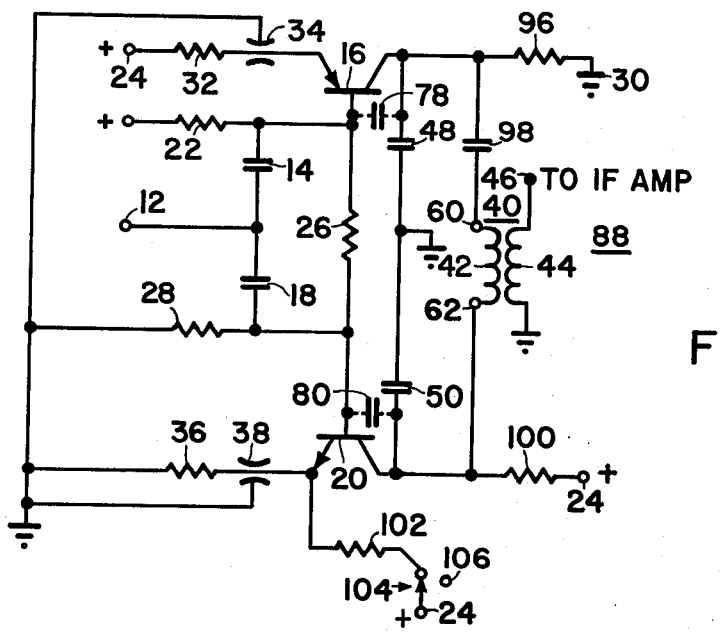
FIG. 6 illustrates modifications of the mixer circuit of FIG. 1 to enable it to operate as an IF amplifier in the system of FIG. 5.

FIG. 6 illustrates a modified version of mixer circuit 10 of FIG. 1 which operates as an IF amplifier in a receiver system such as illustrated in FIG. 5 during UHF operation and as a mixer during VHF operation. More specifically, Mixer/Amplifier circuit 88 is identical to circuit 10 except for the addition of components 96, 98, 100, 102 and 104. Components in FIG. 6 corresponding to those of FIG. 1 are designated by corresponding reference numbers. Resistor 96 is connected between the collector of transistor 16 and ground terminal 30. Resistor 100 is connected between the collector of transistor 20 and positive supply terminal 24. Resistors 96 and 100 complete a DC path for respective transistors 16 and 20. Capacitor 98 is connected between terminal 60 and the collector of transistor 16 to provide DC blocking. Switch 104 selectively completes a circuit from the emitter of transistor 20 through resistor 102 to the positive supply rail or terminal 24 to disable transistor 20 and allow circuit 88 to operate as an IF amplifier during UHF reception. Switch 104 is connected to terminal 106 to open circuit the foregoing series path when circuit 88 is operated as a mixer during VHF reception. When switch 104 connects terminal 24 to the emitter of transistor 20, the positive voltage back biases the emitter-to-base junction of transistor 20 and renders it nonconductive. Thus the input signal from Tuner/Amplifier 86, for instance, passes through capacitor 14 and is amplified by transistor 16. The amplified signal is then passed through transformer 40 to IF amplifier 90.

Figure 7:
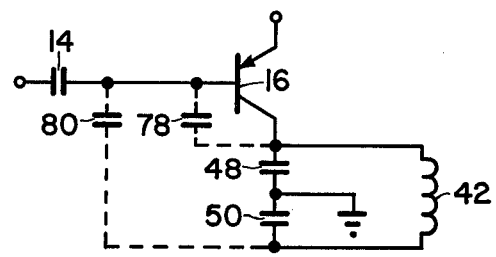
FIG. 7 illustrates self neutralization by the circuit of FIG. 6 when utilized as an IF amplifier.

FIG. 7 shows a portion of the circuitry of FIG. 6 wherein like reference numbers are utilized to designate corresponding components. During operation of circuit 88 as an IF amplifier, unwanted IF signals are coupled through junction capacitance 78 to the base of transistor 16. Such signals could result in distortion and spurious outputs except that they are neutralized by corresponding but out-of-phase signals coupled through junction capacitance 80 to the base of transistor 16, assuming that capacitances 78 and 80 are matched.

Figure 8:
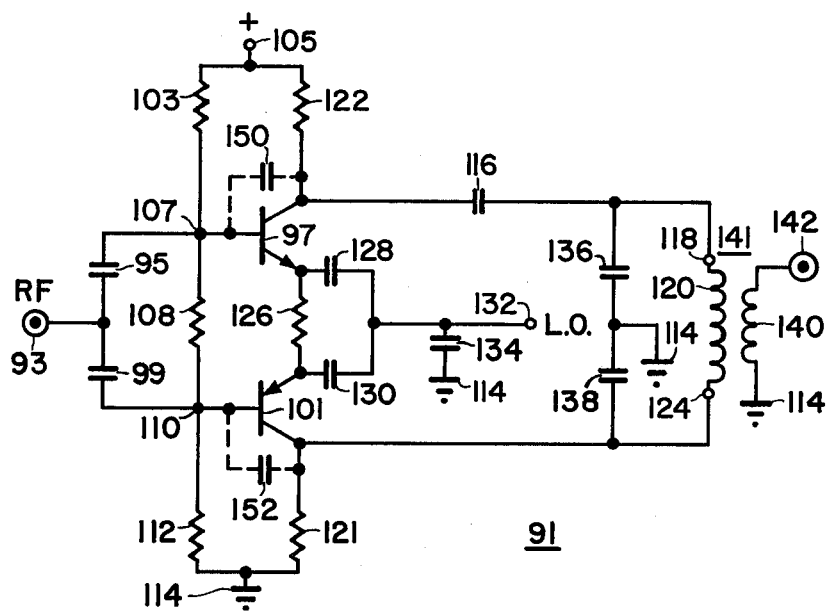
FIG. 8 is a schematic diagram of another embodiment of the mixer circuit of the invention.

FIG. 8 illustrates an alternative embodiment 91 of the frequency changing circuit of the invention. The RF or mixer input signal is applied to input terminal 93 which is connected through capacitor 95 to the base electrode of NPN transistor 97 and through capacitor 99 to the base electrode of PNP transistor 101. Bias resistor 103 is connected from positive supply terminal 105 to circuit junction 107. Bias resistor 108 is connected from circuit junction 106 to circuit junction 110. Junctions 106 and 110 are connected to the base electrodes of respective transistors 97 and 101. Bias resistor 112 is connected from circuit junction 110 and the base electrode of transistors 101 to negative power supply conductor 114. Resistors 103, 108 and 112 establish the quiescent bias levels for transistors 96 and 100.

The collector electrode of transistor 97 is coupled through DC blocking capacitor 116 to end 118 of primary winding 120 and through resistor 122 to positive power supply terminal 105. The collector electrode of transistor 101 is connected to the other end 124 of primary winding 120 and through resistor 121 to terminal or conductor 114. The emitter electrode of transistor 97 is connected through resistor 126 to the emitter electrode of transistor 101. Capacitors 128 and 130 respectively couple the emitter electrodes of transistors 97 and 101 to another input terminal 132 which is adapted for receiving the local oscillator signal. Capacitor 134 is connected between terminal 132 and the negative or reference power supply conductor 114. Capacitor 136 is connected between power supply ground conductor or terminal 114 and to end 118 of primary winding 120. Similarly, capacitor 138 is connected between terminal 114 and end 124 of primary winding 120. Secondary winding 140 of transformer 141 is connected between mixer output terminal 142 and negative power supply terminal 114. Devices 97 and 101 of circuit 91 respectively include collector-to-base junction capacitances 150 and 152.

Circuit 91 of FIG. 8 operates in a manner similar to that previously described for and has the advantages identified with the operation of circuit 10 of FIG. 1. Circuit 91 has the further advantage with respect to circuit 10 that it might be more reproducible in some applications because it doesn't have to be as precisely balanced. However, circuit 91 has the disadvantage that it requires more components than circuit 10.

What has been described, therefore, are improved mixer circuit configurations which develop less distortion than most known mixer configurations. The mixer circuits are suitable for use in many different systems including television receivers. The local oscillator and other mixer input signals are applied in-phase across output circuit transformer windings 42 or 120 which results in substantial cancellation thereof. Hence, these signals are not available to cause distortion in subsequent stages. Consequently spurious signals and distortion, which otherwise could be caused, are eliminated by the configurations of mixer circuits 10 and 91. Also, IF and other signals fed back through capacitors 78 and 80, or 150 and 152 to the unbalanced input tend to be neutralized therein. In addition other input nonlinearities including those associated with the mixing devices are balanced out in the input circuit.

Moreover, since the input signals applied to terminal 12, or 93 and 132, are divided between transistors 16 and 20 or 97 and 101, such input signals can have greater magnitudes without causing an overload of circuit 10 or 91 than for circuits including a mixer circuit configuration including one bipolar transistor, for instance. Consequently, mixer circuits 10 and 91 can handle higher level input signals without distortion and with less cross modulation. The frequency changing circuits 10 and 91 tend to reduce driving source distortion by presenting a substantially constant input impedance and are simpler than some other mixer configurations from the point of view of not requiring a plurality of sophisticated external inductors, for example. Therefore, some or all of the components of mixers 10 and 91 can be provided in integrated circuit form either by themselves or in combination with other circuits. Also, complementary transistors 16 and 20 or 97 and 101 could be provided by themselves in a common piece of semiconductor material so that they can be more easily fabricated to have matched parameters and so that they can be more readily kept at substantially equal operating temperatures.

I claim:
1. A frequency changing circuit including in combination:
   first power supply conductor means for providing a power supply potential of one polarity;
   second power supply conductor means for providing a power supply potential of the other polarity;
   unbalanced input circuit means having first and second terminals, said unbalanced input circuit means providing a local oscillator signal and an input signal at first and second terminals thereof;
   first electron control means of a first conductivity type coupled between said first power supply conductor means and said first terminal of said unbalanced input circuit means, said first electron control means having an output electrode and said first electron control means providing an output signal at said output electrode thereof;
   second electron control means of a second conductivity type coupled between said second terminal of said unbalanced input circuit means and said second power supply conductor means, said second electron control means having an output electrode, and said second electron control means providing an output signal at said output electrode thereof; and
   tuned circuit means coupled between said output electrodes of said first and second electron control means for selecting a balanced intermediate frequency signal in response to said output signals of said first and second electron control means, said first and second electron control means providing said local oscillator signal and said input signal in phase across said tuned circuit means so that substantially no local oscillator and no input signal components are produced in said tuned circuit means.

2. The frequency changing circuit of claim 1 wherein:
said unbalanced input circuit means provides only said input signal at said first terminal and only said local oscillator signal at said second terminal thereof; and
each of said electron control means is coupled to both of said terminals of said unbalanced input circuit means.

3. The frequency changing circuit of claim 1 further including bias means coupled between said first and second electron control means annd said first and second power supply conductor means for establishing the quiescent bias levels of said first and second electron control means.

4. The frequency changing circuit of claim 1 wherein:
first electron control means is a bipolar transistor of said first conductivity type having predetermined electrical parameters; and
said second electron control means is a bipolar transistor of said second conductivity type having electrical parameters which are closely matched to said predetermined electrical parameters of said bipolar transistor of said first conductivity type.

5. The frequency changing circuit of claim 1 wherein each of said first and second electron control means further have control and input electrodes and further including capacitive means coupled between said control electrodes of each of said first and second electron control means and said tuned circuit means for feeding back intermediate frequency signal components which are 180° out of phase and of substantially equal magnitudes so that said intermediate frequency signal components are cancelled within said unbalanced input circuit means for reducing the tendency of said intermediate frequency signals to mix with the input and local oscillator signals and produce spurious responses.

6. The frequency changing circuit of claim 1 wherein said first electron control means includes a PNP bipolar transistor and said second electron control means includes a NPN bipolar transistor, said bipolar transistors both being fabricated in the same semiconductor chip and having substantially matched parameters so that said bipolar transistors tend to cancel the base-to-emitter nonlinearities of each other.

7. The frequency changing circuit of claim 1 wherein:
said first and second electron control means each have input, control and output electrodes;
said unbalanced input circuit means includes a first capacitive means connected from an input terminal of the frequency changing circuit to the control electrode of the first electron control means and a second capacitive means connected from the input terminal of the frequency changing circuit to the control electrode of said second electron control means; and
bias means including first resistive means connected between said first power supply conductor means and said control electrode of said first electron control means, second resistive means connected between said control electrodes of said first and second electron control means, and third resistive means connected between said control electrode of said second electron control means and said second power supply conductor means.

8. The frequency changing circuit of claim 7 further including:
third capacitive means connected between said output electrode of said first electron control means and said second power supply conductor means;
fourth capacitive means connected from said output electrode of said second electron control means and said second power supply conductor means; and
inductive means connected between said output electrodes of said first and second electron control means for forming a parallel resonant circuit with said third and fourth capacitive means which resonates at the intermediate frequency.

9. The frequency changing circuit of claim 1 further including:
means for disconnecting the local oscillator signal from said frequency changing circuit; and
means for rendering one of said electron control means nonoperative so that the other of said electron control means can operate as an amplifier.

10. The frequency changing circuit of claim 8 wherein said one of said electron control means is arranged to provide a neutralizing feedback signal to said other electron control means while said one of said electron control means is inoperative.

11. The frequency changing circuit of claim 10 wherein said first electron control means includes a PNP bipolar transistor and said second electron control means include a NPN bipolar transistor, said bipolar transistors both being fabricated in the same semiconductor chip and having substantially matched parameters.

12. The frequency changing circuit of claim 10 further including an additional winding coupled to said balanced tuned circuit means for providing an unbalanced output signal.

13. A frequency changing circuit suitable for combining the frequencies of a local oscillator signal and an input signal to provide an output signal having a predetermined frequency, including in combination:
first power supply conductor means adapted to provide a power supply potential of the first polarity;
second power supply conductor means adapted to provide a power supply potential of a second polarity;
unbalanced input circuit means adapted to provide said local oscillator signal and said input signal at first and second terminals thereof;
first electron control means having a control electrode connected to said first terminal, a first electrode coupled to said first power supply conductor means, and an output electrode, said first electron control means being rendered more conductive in response to alternate half cycles of said local oscillator signal of one polarity;
second electron control means having a control electrode connected to said second terminal, a first electrode coupled to said power supply conductor means, and an output electrode, said second electron control means being rendered more conductive in response to alternate half cycles of said local oscillator signal of the other polarity;
balanced tuned circuit means connected between said output electrodes of said first and second electron control means and which is arranged to select and provide signals of the predetermined frequency which are 180° out-of-phase with respect to each other; and first capacitive means coupled between said control and output electrodes of said first and second electron control means, second capacitive means coupled between said control and output electrodes of said second electron control means, said first and second capacitive means coupling said 180° out-of-phase signals of the predetermined frequency to said unbalanced input circuitry wherein said signal of the predetermined frequency are substantially cancelled.

14. The frequency changing circuit of claim 13 further including in combination:

switch means for selectively coupling one of the electrodes of one of said first and second electron control means to one of said power supply conductors for rendering said one of said first and second electron control means nonconductive so that said other of said first and second electron control means can operate as an amplifying device, said one of said first and second capacitive means enabling substantial neutralization of said signals of said predetermined frequency through said other of said first and second capacitive means.

* * * * *